United States Patent
Shan

(10) Patent No.: US 11,417,255 B2
(45) Date of Patent: Aug. 16, 2022

(54) DRIVING CIRCUIT FOR DISPLAY PANEL AND DISPLAY DEVICE

(71) Applicant: HKC CORPORATION LIMITED, Shenzhen (CN)

(72) Inventor: Jianfeng Shan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 689 days.

(21) Appl. No.: 16/326,932

(22) PCT Filed: Nov. 21, 2018

(86) PCT No.: PCT/CN2018/116617
§ 371 (c)(1),
(2) Date: Feb. 21, 2019

(87) PCT Pub. No.: WO2020/097958
PCT Pub. Date: May 22, 2020

(65) Prior Publication Data
US 2021/0366335 A1    Nov. 25, 2021

(30) Foreign Application Priority Data
Nov. 14, 2018   (CN) .......................... 201821871923.4

(51) Int. Cl.
*G09G 3/20* (2006.01)
*H05K 1/11* (2006.01)

(52) U.S. Cl.
CPC ............... *G09G 3/20* (2013.01); *H05K 1/111* (2013.01); *H05K 2201/10128* (2013.01); *H05K 2201/10189* (2013.01)

(58) Field of Classification Search
CPC ....................................................... G09G 3/20
USPC ............................................................ 345/204
See application file for complete search history.

(56) References Cited

U.S. PATENT DOCUMENTS

| | | | | |
|---|---|---|---|---|
| 2005/0044702 A1* | 3/2005 | Shaeffer | ............... | H05K 1/0293 29/830 |
| 2006/0043158 A1* | 3/2006 | Wang | .................... | B23K 35/02 228/245 |

FOREIGN PATENT DOCUMENTS

| | | | |
|---|---|---|---|
| CN | 203217928 U | | 9/2013 |
| CN | 204291580 U | | 4/2015 |
| CN | 204634160 | * | 9/2015 |
| CN | 204634160 U | | 9/2015 |
| CN | 105319787 A | | 2/2016 |
| CN | 105974622 | * | 9/2016 |
| CN | 105974622 A | | 9/2016 |
| CN | 107103889 A | | 8/2017 |
| JP | H10145015 A | | 5/1998 |

OTHER PUBLICATIONS

International Search Report issued in corresponding International application No. PCT/CN2018/116617, dated Jul. 25, 2019.
Written Opinion of the International Searching Authority for No. PCT/CN2018/116617.

* cited by examiner

*Primary Examiner* — Stanley Tso

(57) ABSTRACT

The present invention discloses a driving circuit for a display panel and a display device. The driving circuit includes a driving circuit board configured to carry a driving circuit, and first pads located on the driving circuit. The first pads are connected through a detachable connector.

20 Claims, 2 Drawing Sheets

DRIVING CIRCUIT FOR DISPLAY PANEL AND DISPLAY DEVICE

The present application claims priority to Chinese Patent Application No. CN201821871923.4, filed to the Chinese Patent Office on Nov. 14, 2018, and entitled "DRIVING CIRCUIT FOR DISPLAY PANEL AND DISPLAY DEVICE", which is incorporated herein by reference in its entirety.

TECHNICAL FIELD

The present application relates to the technical field of display, and in particular, to a driving circuit for a display panel and a display device.

BACKGROUND

The statements herein merely provide background information related to the present application and do not necessarily constitute the prior art.

With the development and advancement of technology, flat panel displays have become mainstream display products due to their thin bodies, power saving and low radiation, etc., and have been widely used. The flat panel display includes a thin film transistor-liquid crystal display (TFT-LCD). The thin film transistor-liquid crystal display controls a rotation direction of liquid crystal molecules to refract light of a backlight module to produce a picture, and has many advantages such as thin body, power saving, and no radiation.

In the design process of the display panel, it is necessary to measure other parameters such as current on a power circuit. A current design is to add a dog bone device at a power output end, and short-circuit two pads. In actual use, it is necessary to cut off a line between the pads. The circuit is often damaged during the cutting process, resulting in the circuit not working.

SUMMARY

An objective of the present application is to provide a driving circuit for a display panel and a display device, which can avoid circuit damage during measurement.

To achieve the above objective, the present application provides a driving circuit for a display panel, which includes:

a driving circuit board configured to carry a driving circuit, and first pads located on the driving circuit, where the number of the first pads is at least two, and the first pads are configured to measure a parameter of a power output end; and the first pads are connected through a detachable connector.

Optionally, the connector includes a first solder and second pads, where the second pads are distributed between the first pads; and the first pads and the second pads are connected through the first solder.

Optionally, the second pad has a smaller size than the first pad.

Optionally, an interval between the first pad and the second pad is smaller than a maximum interval covered by tension of the first solder.

Optionally, the number of the second pads is at least two, and the second pads are connected through the first solder; and an interval between the second pads is smaller than a maximum interval covered by the tension of the first solder.

Optionally, the connector includes a second solder, and the first pads are connected through the second solder; and an interval between the first pads is smaller than a maximum interval covered by tension of the second solder.

Optionally, the maximum interval covered by the tension of the second solder is 0.2 mm.

Optionally, the driving circuit board includes a circuit layer and a solder resist layer; the solder resist layer is located on a first contact surface of the circuit layer, and the solder resist layer covers an area of the driving circuit board except the first pads; and the second solder covers the circuit layer.

The present application also discloses a driving circuit for a display panel, which includes:

a driving circuit board configured to carry a driving circuit, and first pads located on the driving circuit, where the number of the first pads is at least two, and the first pads are configured to measure a parameter of a power output end; the first pads are connected through a detachable connector; the connector includes a first solder and second pads, where the first solder is distributed between the first pads and the second pads, and the second pads are connected with each other; the second pads are connected with the first pads; the second pads are distributed between the first pads, and the second pad has a smaller size than the first pad; an interval between the second pads is smaller than a maximum interval covered by tension of the first solder, and an interval between the first pad and the second pad is smaller than a maximum interval covered by tension of the first solder.

The present application also discloses a display device, which includes a driving circuit for a display panel, where the driving circuit includes:

a driving circuit board configured to carry a driving circuit, and first pads located on the driving circuit, where the number of the first pads is at least two, and the first pads are configured to measure a parameter of a power output end; and the first pads are connected through a detachable connector.

Optionally, the connector includes a first solder and second pads, where the second pads are distributed between the first pads; and the first pads and the second pads are connected through the first solder.

Optionally, the second pad has a smaller size than the first pad.

Optionally, an interval between the first pad and the second pad is smaller than a maximum interval covered by tension of the first solder.

Optionally, the number of the second pads is at least two, and the second pads are connected through the first solder, and an interval between the second pads is smaller than a maximum interval covered by the tension of the first solder.

Optionally, the connector includes a second solder, and the first pads are connected through the second solder; and an interval between the first pads is smaller than a maximum interval covered by tension of the second solder.

Optionally, the maximum interval covered by the tension of the second solder is 0.2 mm.

Optionally, the driving circuit board includes a circuit layer and a solder resist layer; the solder resist layer is located on a first contact surface of the circuit layer, and the solder resist layer covers an area of the driving circuit board except the first pads; and the second solder covers the circuit layer.

Compared with the solution of short-circuiting pads at two ends, the present application adds a connector between the pads. When it is required to measure a power output end, the connector is disconnected for measurement; when a resistor is required, the resistor can be directly soldered on a first pad, which avoids damage to a circuit when the pad is directly circuit-shorted to cut the circuit; and at the same time a circuit design does not need to be changed, which simplifies workers' operation processes.

BRIEF DESCRIPTION OF DRAWINGS

The drawings are included to provide understanding of embodiments of the present application, which constitute a part of the specification and illustrate the embodiments of the present application, and illustrate the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
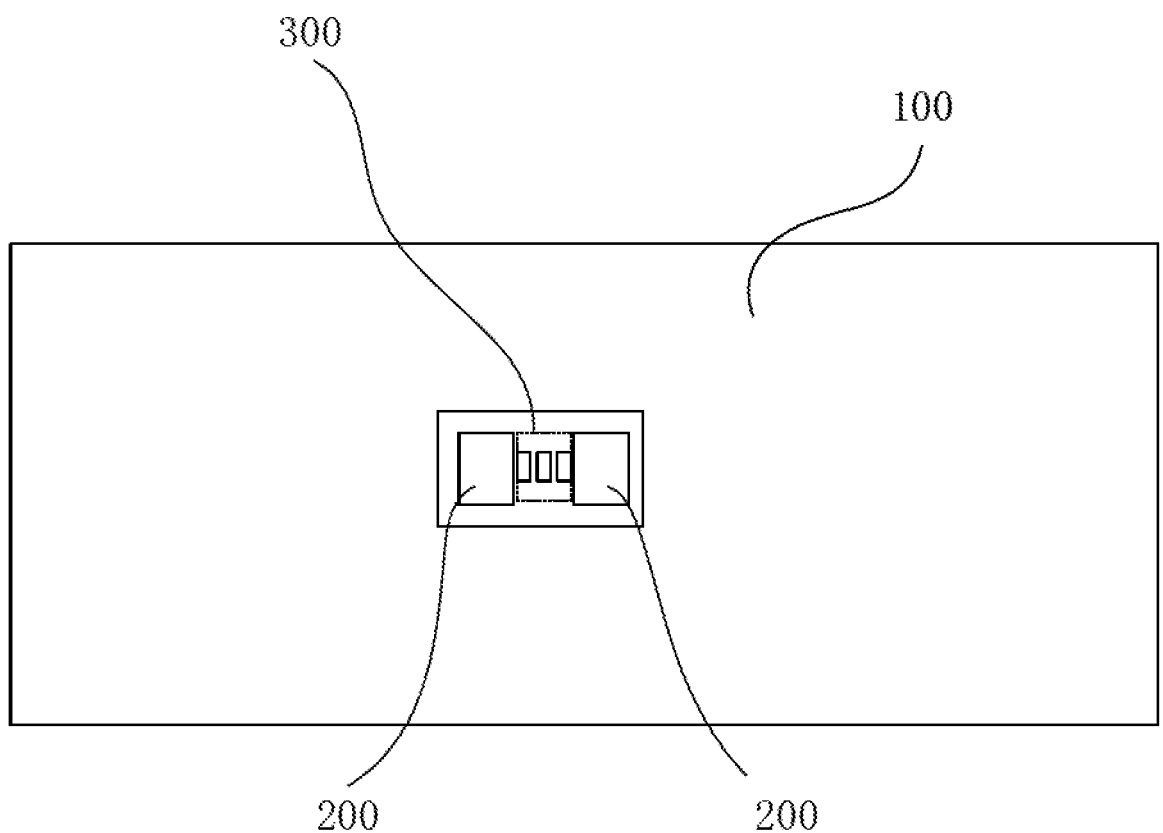
FIG. 1 is a schematic view of a display panel circuit according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present application will be described below with reference to the accompanying drawings and optional embodiments.

Referring to FIGS. 1 to 5, an embodiment of the present application discloses a driving circuit for a display panel, which includes: a driving circuit board 100 configured to carry a driving circuit, and first pads 200 located on the driving circuit 100, where the number of the first pads 200 is at least two, and the first pads 200 are configured to measure a parameter of a power output end; and the first pads 200 are connected through a detachable connector.

In this solution, when the circuit board is designed, the parameter of the power output end needs to be measured. Compared with a solution of directly short-circuiting the two pads, an external force is required during measurement for forced cut-off, and the circuit is easily damaged during the cutting process, resulting in the circuit not working normally. In this design, a detachable connector is added between the first pads 200, and the connector connects the two first pads 200. When measurement is required, the connector is disconnected and then measurement can be performed. when a resistor is required, the resistor can be directly soldered on the first pad 200 with no need to change a circuit design, thereby simplifying workers' operation.

In an embodiment, the connector includes a first solder 200 and second pads 300, where the second pads 300 are distributed between the first pads 200; and the first pads 200 and the second pads 300 are connected through the first solder.

In this solution, the connector is added between the first pads 200 to detect an output power supply parameter of the driving circuit, and a distance between the first pads 200 is shortened by adding the second pads 300; and at the same time, the first solder is added on the second pad 300. In the process of adding the first solder, the second pads 300 are connected to each other due to the tension of the solder, and the second pads 300 are also connected to the first pads 200 during the soldering process, so that the whole pads are connected together. When the measurement is performed, it is only necessary to remove tin on the second pad 300 by a soldering iron, so that the first pads 200 are disconnected. Such a design is simple to operate and does not damage the driving circuit board 100. At the same time, when the power output end needs to be replaced by a zero ohm resistor, only the first pad 200 needs to be soldered again, and the circuit does not need to be changed again, thereby reducing design changes. The second pads 300 are distributed between the first pads 200, and the second pads 300 are equally spaced to facilitate the connection between the pads.

In an embodiment, the second pad 300 has a smaller size than the first pad 200.

In this solution, in order to connect the first pads 200, the size of the second pad 300 may be adjusted correspondingly, and the size of the second pad 300 is smaller than that of the first pad 200, which is convenient for a designer to grasp the distance between the pads. The shapes and sizes of the second pads 300 can be made uniform. At this time, the amount of tin required in the process of soldering is uniform, which is advantageous for the solder to be distributed on the second pads 300.

In an embodiment, an interval between the first pad 200 and the second pad 300 is smaller than a maximum interval covered by tension of the first solder.

In this solution, the first pad 200 and the second pad 300 are directly connected by the first solder, and correspondingly, the distance between the two is smaller than the maximum interval covered by the tension of the first solder, so that during the soldering process, the solder on the second pad 300 and the solder on the first pad 200 are connected together due to the tension effect of the solder.

In an embodiment, the number of the second pads 300 is at least two, and the second pads 300 are connected through the first solder; and an interval between the second pads 300 is smaller than a maximum interval covered by tension of the first solder.

In this solution, an interval between the second pads 300 is smaller than a maximum interval covered by the tension of the first solder, which facilitates internal connections between the second pads.

Figure 2:
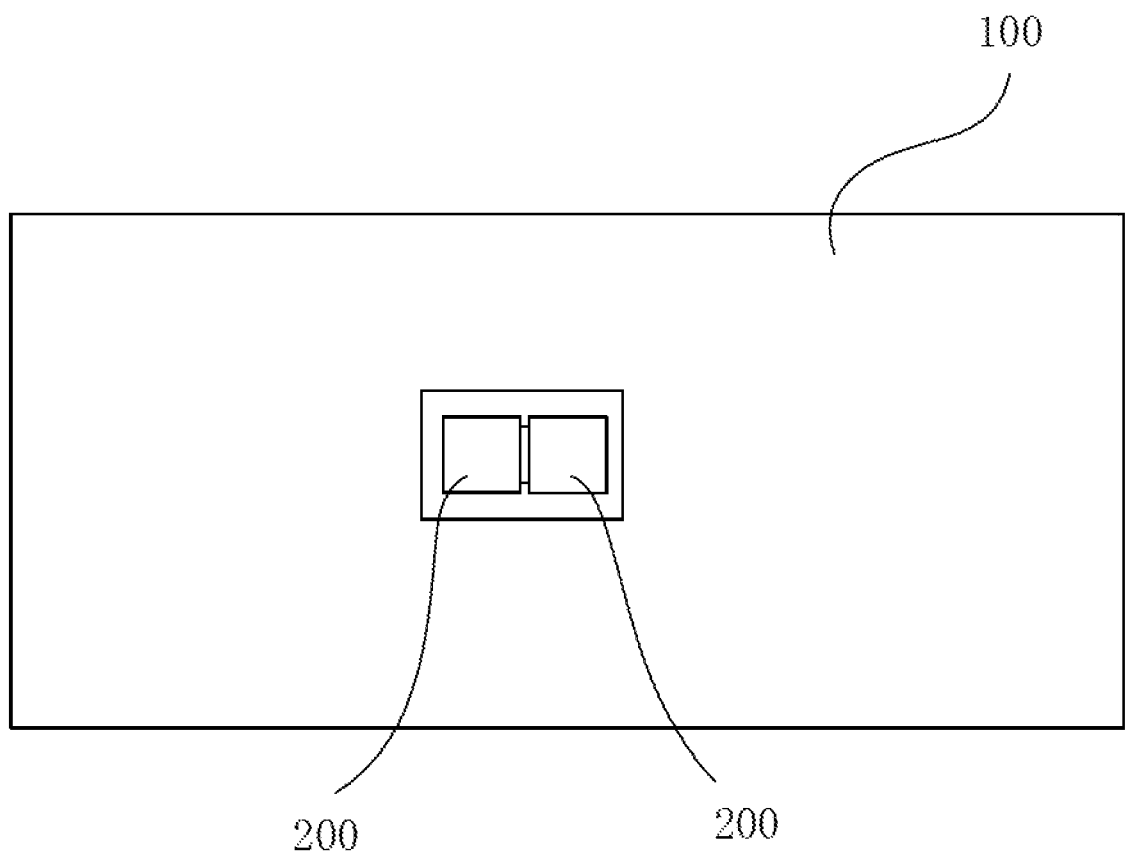
FIG. 2 is a schematic view of a display panel circuit according to another embodiment of the present application.

Referring to FIG. 2, this embodiment provides an alternative to the display panel circuit. The connector includes a second solder, and the first pads 200 are connected through the second solder; and an interval between the first pads 200 is smaller than a maximum interval covered by tension of the second solder.

In this solution, the first pads 200 are directly connected by the second solder, and correspondingly, the distance between the first pads 200 is smaller than the maximum value of the solder tension connection, so that during the soldering process, due to the tension effect of the solder, the solders on the first pads 200 are connected together, and the first pads 200 are connected with each other. Since the distance between the first pads 200 is reduced, the corresponding widths of the first pads 200 are increased compared with the previous design, and the area of the first pads 200 is correspondingly increased.

In an embodiment, a maximum interval covered by tension of the second solder is 0.2 mm.

In this solution, it has been found through study by the applicant that when the second solder is applied to the driving circuit board in this design, a maximum distance of tension connection of the second solder is 0.2 mm, and the pad subjected to soldering beyond the distance cannot be connected.

In an embodiment, the driving circuit board 100 includes a circuit layer 120 and a solder resist layer 110. The solder resist layer 110 is located on a first contact surface 130 of the circuit layer 120, and the solder resist layer 110 covers an area of the driving circuit board 100 except the first pads 200. The second solder covers the circuit layer 120.

In this solution, the solder resist layer 110 of the driving circuit board 100 covers the first contact surface 130 of the circuit layer 120, and the first contact surface 130 is an upper surface of the circuit layer 120, covering a substrate between lines to prevent short circuit between the lines. We remove the solder resist layer 110 between the first pads 200, i.e., solder resist ink is not used in this area to facilitate a connection between the solders.

Referring to FIG. 1, an embodiment of the present application also discloses a driving circuit for a display panel, which includes:

a driving circuit board 100 configured to carry a driving circuit, and first pads 200 located on the driving circuit 100, where the number of the first pads 200 is at least two, and the first pads 200 are configured to measure a parameter of a power output end; the first pads 200 are connected through a detachable connector; the connector includes a first solder and second pads 300, where the first solder is distributed between the first pads 200 and the second pads 300, and the second pads 300 are connected with each other; the second pads 300 are connected with the first pads 200; the second pads 300 are distributed between the first pads 200, and the second pad 300 has a smaller size than the first pad 200, and shapes and sizes of the second pads 300 are consistent; an interval between the second pads 300 is smaller than a maximum interval covered by tension of the first solder, and an interval between the first pad 200 and the second pad 300 is smaller than a maximum interval covered by tension of the first solder.

In this solution, when the circuit board is designed, the parameter of the power output end needs to be measured. Compared with a solution of directly short-circuiting the two pads, an external force is required during measurement for forced cut-off, and the circuit is easily damaged during the cutting process, resulting in the circuit not working normally. In this design, a detachable connector is added between the first pads 200, and the connector connects the two first pads 200. When measurement is required, the connector is disconnected and then measurement can be performed. When a resistor is required, the resistor can be directly soldered on the first pad 200 with no need to change a circuit design, thereby simplifying workers' operation. The connector is added between the first pads 200 to detect an output power supply parameter of the driving circuit, and a distance between the first pads 200 is shortened by adding the second pads 300; and at the same time, the first solder is added on the second pad 300. In the process of adding the first solder, the second pads 300 are connected to each other due to the tension of the solder, and the second pads 300 are also connected to the first pads 200 during the soldering process, so that the whole pads are connected together. When the measurement is performed, it is only necessary to remove tin on the second pad 300 by a soldering iron, so that the first pads 200 are disconnected. Such a design is simple to operate and does not damage the driving circuit board 100. At the same time, when the power output end needs to be replaced by a zero ohm resistor, only the first pad 200 needs to be soldered again, and the circuit does not need to be changed again, thereby reducing design changes. The second pads 300 are distributed between the first pads 200, and the second pads 300 are equally spaced to facilitate the connection between the pads. In order to connect the first pads 200, the size of the second pad 300 may be adjusted correspondingly, and the size of the second pad 300 is smaller than that of the first pad 200, which is convenient for a designer to grasp the distance between the pads. The shapes and sizes of the second pads 300 are uniform. The amount of tin required in the process of soldering is uniform, which is advantageous for the solder to be distributed on the second pads 300. The first pads 200 are directly connected by the first solder, and correspondingly, the distance between the second pads 300 is smaller than a maximum interval covered by tension of the first solder, so that during the soldering process, due to the tension effect of the solder, the solders on the first pads 300 are connected together, and the second pads 200 are connected with each other. Similarly, an interval between the first pad 200 and the second pad 300 is smaller than a maximum interval covered by tension of the first solder.

Figure 3:
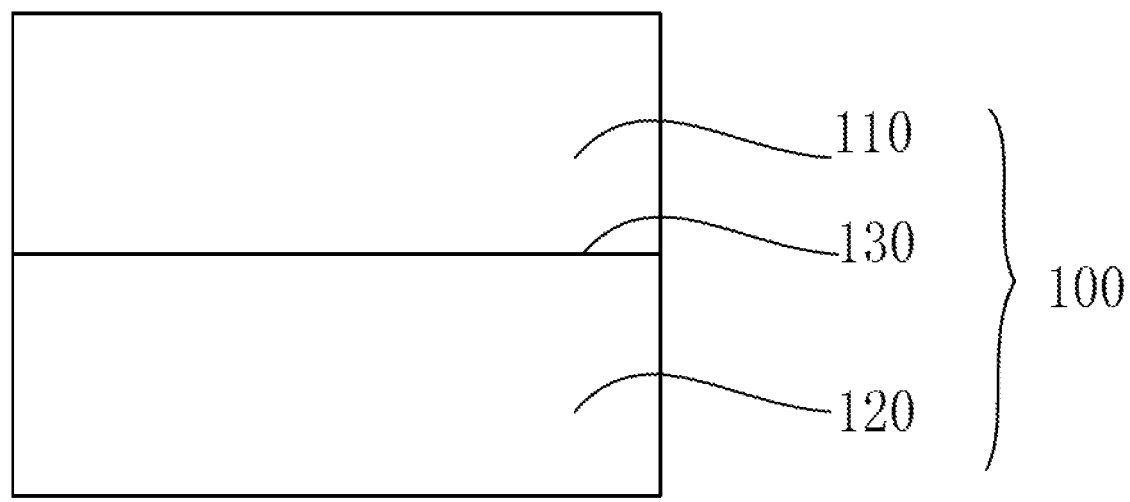
FIG. 3 is a schematic view of a hierarchical structure of a driving circuit board according to another embodiment of the present application.

Referring to FIGS. 1 to 3, an embodiment of the present application also discloses a display device which includes the display panel driving circuit of any one of the above.

The panel of the present application may be a twisted nematic (TN) panel, an in-plane switching (IPS) panel, or a multi-domain vertical alignment (MVA) panel, and of course, the panel may also be other types of panels, as long as the panels are suitable.

The above are detailed descriptions of the present application in conjunction with the specific optional embodiments, but the specific implementation of the present application cannot be determined as limited to these descriptions. For a person of ordinary skill in the art to which the present application pertains, a number of simple deductions or substitutions may also be made without departing from the concept of the present application. All these should be considered as falling within the scope of protection of the present application.

What is claimed is:

1. A driving circuit for a display panel, comprising:
   a driving circuit board, carrying the driving circuit of the display panel, wherein the driving circuit of the display panel comprises a power output end; and
   at least two first pads, disposed on the driving circuit, wherein the first pads are configured to measure a parameter of the power output end; and the first pads are connected through a detachable connector;
   wherein when measurement of the power output end is required the detachable connector is disconnected and the measurement is performed, and when a resistor is required for the power output end the resistor is directly soldered onto the first pads.

2. The driving circuit for a display panel according to claim 1, wherein the connector comprises a first solder and second pads, wherein the second pads are distributed between the first pads; and the first pads are detachably connected to each other through the second pads and the first solder.

3. The driving circuit for a display panel according to claim 2, wherein the second pad has a smaller size than the first pad.

4. The driving circuit for a display panel according to claim 3, wherein an interval between the first pad and the second pad is smaller than a maximum interval covered by tension of the first solder.

5. The driving circuit for a display panel according to claim 3, wherein the number of the second pads is at least two, and the second pads are connected through the first solder; and an interval between the second pads is smaller than the maximum interval covered by the tension of the first solder.

6. The driving circuit for a display panel according to claim 2, wherein when the measurement is performed, a soldering iron is used to remove tin on the second pads thus disconnecting the connection between the first pads.

7. The driving circuit for a display panel according to claim 1, wherein the connector comprises a second solder, and the first pads are connected through the second solder; and an interval between the first pads is smaller than a maximum interval covered by tension of the second solder.

8. The driving circuit for a display panel according to claim 7, wherein the maximum interval covered by the tension of the second solder is 0.2 mm.

9. The driving circuit for a display panel according to claim 8, wherein the driving circuit board comprises a circuit layer and a solder mask layer; the solder mask layer is disposed on a first contact surface of the circuit layer, and the solder mask layer covers an area of the driving circuit board except the first pads; and the second solder covers the circuit layer.

10. The driving circuit for a display panel according to claim 1, wherein the second pads are used for the sole purpose of connecting the first pads together when the resistor is required for the power output end and the resistor is directly soldered onto the first pads, and wherein the second pads are not connected to the driving circuit when measuring the parameter of the power output end and the detachable connector is disconnected.

11. A display device, comprising a driving circuit for a display panel, wherein the driving circuit comprises:
    a driving circuit board, carrying the driving circuit of the display panel, wherein the driving circuit of the display panel comprises a power output end; and
    at least two first pads, disposed on the driving circuit, wherein the first pads are configured to measure a parameter of the power output end; and the first pads are connected through a detachable connector;
    wherein when measurement of the power output end is required the detachable connector is disconnected and the measurement is performed, and when a resistor is required for the power output end, the resistor is directly soldered onto the first pads.

12. The display device according to claim 11, wherein the connector comprises a first solder and second pads, wherein the second pads are distributed between the first pads; and the first pads are detachably connected to each other through the second pads and the first solder.

13. The display device according to claim 12, wherein the second pad has a smaller size than the first pad.

14. The display device according to claim 13, wherein an interval between the first pad and the second pad is smaller than a maximum interval covered by tension of the first solder.

15. The display device according to claim 13, wherein the number of the second pads is at least two, and the second pads are connected through the first solder; and an interval between the second pads is smaller than the maximum interval covered by the tension of the first solder.

16. The display device according to claim 11, wherein the connector comprises a second solder, and the first pads are connected through the second solder; and an interval between the first pads is smaller than a maximum interval covered by tension of the second solder.

17. The display device according to claim 16, wherein the maximum interval covered by the tension of the second solder is 0.2 mm.

18. The display device according to claim 17, wherein the driving circuit board comprises a circuit layer and a solder mask layer; the solder mask layer is disposed on a first contact surface of the circuit layer, and the solder mask layer covers an area of the driving circuit board except the first pads; and the second solder covers the circuit layer.

19. A method of measuring a parameter of a power output end of a driving circuit of a display panel, the driving circuit comprising a driving circuit board carrying the driving circuit, and at least two first pads disposed on the driving circuit, wherein the first pads are connected through a detachable connector, the method comprising:

when measurement of the power out end is required, disconnecting the detachable connector and performing the measurement; and when a resistor is required for the power output end, directly soldering the resistor between the first pads.

20. The method according to claim 19, wherein the detachable connector comprises a first solder and at least two second pads distributed between the first pads;

wherein the first pads are detachably connected to each other through the second pads and the first solder.

* * * * *